(12) United States Patent
Dykstra et al.

(10) Patent No.: US 12,255,649 B2
(45) Date of Patent: Mar. 18, 2025

(54) TEMPERATURE-CONTROLLED DRIVER WITH BUILT-IN SELF TESTING OF SWITCH STATUS

(71) Applicant: Murata Manufacturing Co., Ltd., Nagaokakyo (JP)

(72) Inventors: Jeffrey A. Dykstra, Chicago, IL (US); Rodd E. Novak, San Diego, CA (US)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 69 days.

(21) Appl. No.: 18/350,325

(22) Filed: Jul. 11, 2023

(65) Prior Publication Data

US 2024/0106420 A1    Mar. 28, 2024

Related U.S. Application Data

(63) Continuation-in-part of application No. 17/934,787, filed on Sep. 23, 2022, now Pat. No. 11,936,374.

(51) Int. Cl.
*H03K 3/017*    (2006.01)

(52) U.S. Cl.
CPC .................................. *H03K 3/017* (2013.01)

(58) Field of Classification Search
CPC .............. G11C 13/0004; G11C 13/004; G11C 11/5678; G11C 13/0069; G11C 13/0064; G11C 2013/0045; H03K 17/163; H03K 17/166; H03K 17/18; H03K 17/296; H03K 17/56; H03K 17/04206; H03K 17/08122; H03K 17/102; H03K 17/16; H03K 17/165; H03K 17/284; H03K 17/693;

(Continued)

(56) References Cited

U.S. PATENT DOCUMENTS 6,804,502 B2    10/2004    Burgener et al.
8,605,531 B2    12/2013    Kau
(Continued)

FOREIGN PATENT DOCUMENTS

WO    03/096177 A1    11/2003
WO    2022/172277 A1    8/2022

OTHER PUBLICATIONS

International Search Report and Written Opinion issued for International Application No. PCT/US2023/032722 filed on Sep. 14, 2023 on behalf of PSEMI Corporation. Mail Date: Dec. 21, 2023. 13 pages.

(Continued)

*Primary Examiner* — Lincoln D Donovan
*Assistant Examiner* — Tyler J Pereny
(74) *Attorney, Agent, or Firm* — Steinfl + Bruno LLP

(57) ABSTRACT

Methods and devices for reading and programming a state of a switch device are presented. The programming of the state of the switch device is performed by providing driving pulses to the switch device. The amplitude and the width of the driving pulses are a function of one or more of a) temperature of the switch device, b) desired state of the switch device, and c) operational time of the switch device. The described devices include a device to store the data demonstrating the functional relation between the amplitude and the width of the driving pulses and the temperature of the switch device. Such device can be a lookup table or an arithmetic logic unit (ALU). The disclosed switch devices can be PCM switches.

21 Claims, 10 Drawing Sheets

(58) Field of Classification Search
CPC ............ H03K 2217/0027; H02M 1/08; H02M 1/0009; H02M 1/088; H02M 1/38; H02M 3/158
See application file for complete search history.

(56) References Cited

U.S. PATENT DOCUMENTS

| | | | |
|---|---|---|---|
| 10,972,088 B1* | 4/2021 | Barrenscheen | G01K 7/16 |
| 11,936,374 B1 | 3/2024 | Dykstra et al. | |
| 2008/0025080 A1 | 1/2008 | Chan et al. | |
| 2010/0260076 A1 | 10/2010 | Corman et al. | |
| 2010/0328995 A1 | 12/2010 | Shih et al. | |
| 2016/0116345 A1 | 4/2016 | Furtner | |
| 2017/0363676 A1* | 12/2017 | Shapiro | G01R 31/2621 |
| 2020/0059220 A1 | 2/2020 | El-Hinnawy et al. | |
| 2022/0190591 A1 | 6/2022 | Wang et al. | |
| 2022/0199343 A1 | 6/2022 | Taddiken et al. | |
| 2024/0039527 A1 | 2/2024 | Dykstra | |

OTHER PUBLICATIONS

Notice of Allowance for U.S. Appl. No. 17/934,787, filed Sep. 23, 2022 on behalf of pSemi Corporation. Mailed on Nov. 15, 2023. 11 pages.
Non-Final Office Action for U.S. Appl. No. 17/934,787, filed Sep. 9, 2022 on behalf of pSemi Corporation. Mailed on May 5, 2023. 10 pages.

* cited by examiner

TEMPERATURE-CONTROLLED DRIVER WITH BUILT-IN SELF TESTING OF SWITCH STATUS

CROSS-REFERENCE TO RELATED APPLICATIONS

The present application is a continuation-in-part of U.S. patent application Ser. No. 17/934,787 filed on Sep. 23, 2022, the contents of which are incorporated herein by reference in their entirety.

TECHNICAL FIELD

The present disclosure is related to electronic circuits, in particular switch circuits arrangements and, more particularly, drivers with built-in self-testing of switch status.

BACKGROUND

Programming of a switch device for operation according to an OFF state or ON state of the switch device can be unreliable. In particular, when programming the switch device to a desired state, an effective state of the switch device may not be the expected state, as the switch device may switch only partially or may not switch at all. As a consequence, there is a need to verify whether or not a state of a switch device is the expected state.

The above problem may occur in bi-state devices, inclusive of MEMS (micro-electromechanical system) switches and PCM (phase-change material) switches. A PCM switch consists of a volume of phase-change material having two electrical terminals and an adjacent heater, such as a resistor. Under stimulation of thermal energy generated by the heater, the PCM switch can be thermally transitioned between a high-resistivity amorphous state of the phase-change material that defines an OFF state (e.g., high resistance between the two electrical terminals) of the switch, and a low-resistivity crystalline state of the phase-change material that defines an ON state (e.g., low resistance between the two electrical terminals) of the switch. Such thermal energy may be provided by current pulses having specific waveforms, with parameters such as amplitude and duration, conducted through the heater/resistor.

Any variation in the waveforms combined with aging and/or degradation of switching performance of the phase-change material may cause unreliable switching of the PCM switch. The teachings according to the present disclosure address such unreliability, together with similar unreliabilities of other types of switches.

SUMMARY

According to a first aspect of the present disclosure, a switch circuit arrangement is provided, comprising: a control circuit; a switch; a driver circuit coupled to the control circuit and the switch, wherein: a) the control circuit further comprises a program mode of operation that is configured to: i) generate a first control pulse, provided to the driver circuit to program the switch to an ON state; and ii) generate a second control pulse, provided to the driver circuit to program the switch to an OFF state; b) the driver circuit is configured to generate a first driving pulse in correspondence with the first control pulse; c) the driver circuit is configured to generate a second driving pulse in correspondence with the second control pulse, and d) a width and an amplitude of each of the first and the second driving pulses are each a function of a temperature of the switch.

According to a second aspect of the present disclosure, A method of programming a state of a phase change material (PCM) switch, comprising: measuring a temperature of the PCM switch; in correspondence with an ON state of the PCM switch, applying a first driving pulse to the switch; in correspondence with an OFF state of the PCM switch, applying a second driving pulse to the switch, and adjusting an amplitude and a width of the first and the second driving pulses based on the measured temperature of the PCM switch.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

The present disclosure provides a means to measure a resistance of a switch device indicative of an ON or OFF state of the device, such as a PCM device, and further program the state of the device, if needed. While the description of the figures will often make reference to PCM devices/switches, the teachings of the present disclosure are also intended to be applicable to bi-state devices in general, for example MEMS switches, having a first state measurable as a first resistance value and a second state measurable as a second resistance value.

Figure 1:
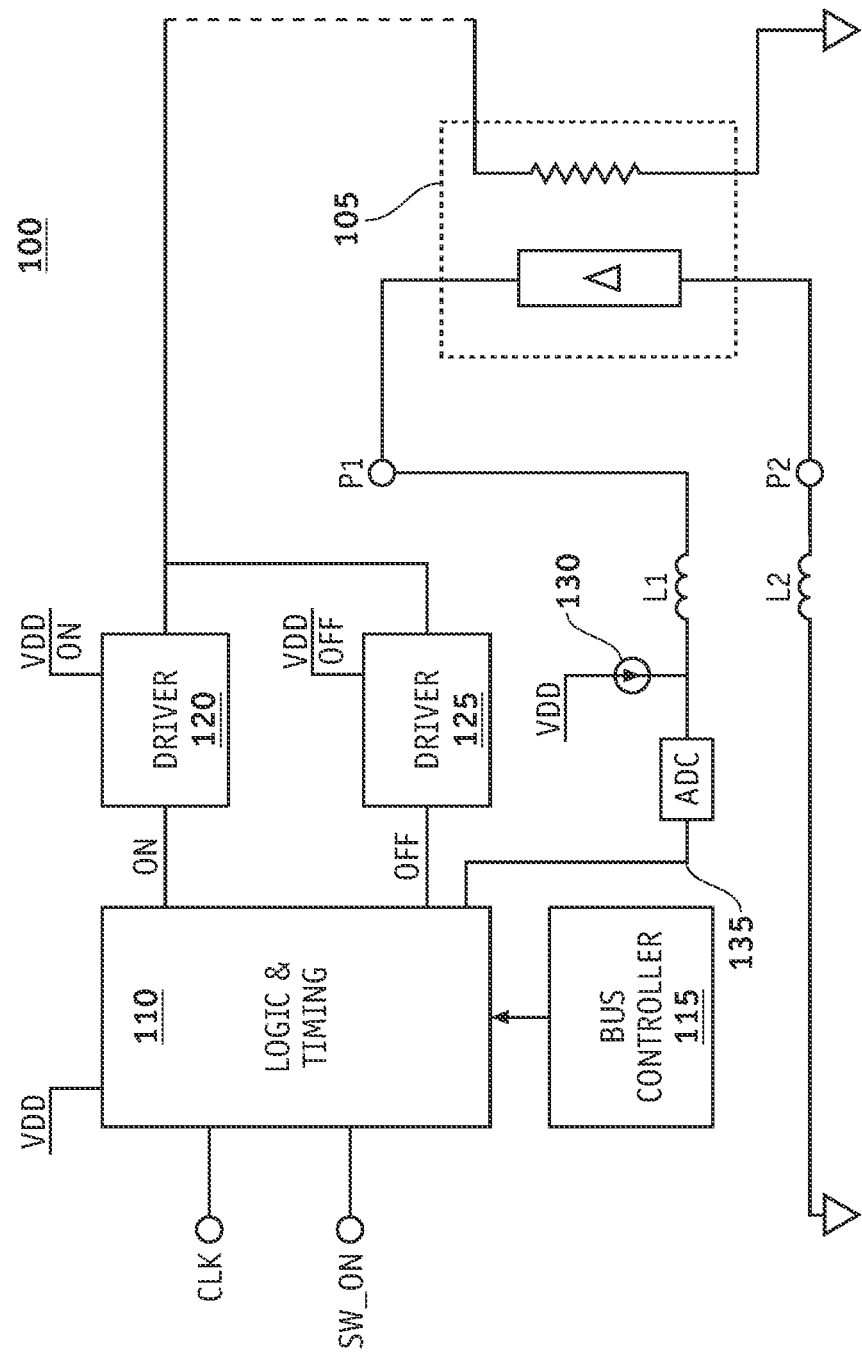
FIG. 1 shows a simplified block diagram of a circuital arrangement in accordance with the present disclosure that is configured to program in a state of a switch device and read the state of the switch device.

FIG. 1 shows a simplified block diagram of a circuital arrangement (100) in accordance with the present disclosure that is configured to program in a state of a switch device (105) and read the state of the switch device (105). In particular, the circuital arrangement (100) may generate pulse waveforms to program in an ON or OFF state of a PCM device (105) having input/output ports (e.g., terminals) P1, P2. A control circuit (110), e.g., a logic and timing circuit, generates ON and OFF pulse waveforms for drivers (120, 125) to accordingly program the PCM device (105) in a desired state. As shown in FIG. 1, the control circuit (110) may be coupled to a controller circuit (115) (e.g., via SPI or MIPI radio frequency front-end control interface, RFFE) for reception of control commands that may dictate configuration/state of the PCM device (105).

In order to provide DC measuring of the resistance of the PCM device (105), or in other words the resistance between ports P1 and P2, RF isolation from ports P1 and P2 of the PCM device (105) is provided through isolation inductors L1 and L2. Apart from a programming mode of operation, control circuit (110) also operates according to a reading mode. In particular, injection of a (resistance) measuring current into e.g., port P1 through the inductor L1, is provided, for example, by a measurement circuit including a current source (130). In this way, an analog DC voltage resulting from conduction of the measuring current through the switch resistance can be measured, and the current state of the PCM device (105) based on a high switch resistance or a low switch resistance can be determined. In particular, the analog voltage value is converted to a digital value through an analog-to-digital converter (ADC) of the measurement circuit and then sent (135) to the logic and timing circuit (110). While only a single bit ADC may be required for the purposes of the diagram of FIG. 1, embodiments are also possible where ADCs with more than one bit are implemented for better resolution, as later explained in more detail.

FIG. 1 shows one driver (120, 125) per switch state, wherein driver (120) is configured to process ON pulse waveforms generated by the control circuit (110) to program the switch (105), and driver (125) is configured to process OFF pulse waveforms generated by the control circuit (110) to program the switch (105). However, other configurations are also possible, such as a single driver for generating both waveforms. An example of such drivers is provided, for example, in U.S. patent application Ser. No. 17/815,193, filed on Jul. 26, 2022 and entitled "Integrated PCM Driver", incorporated herein by reference in its entirety.

Figure 3:
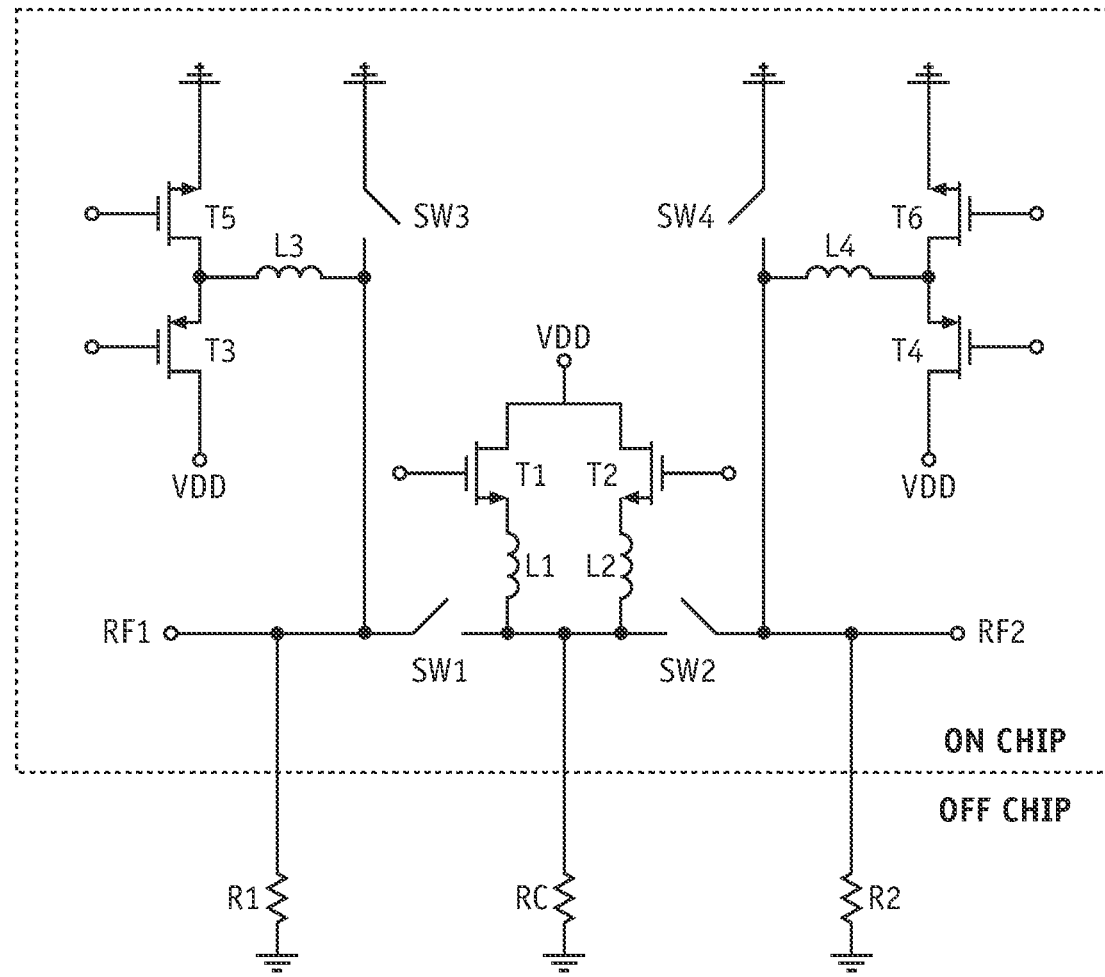
FIG. 3 shows a single-pole double-throw (SPDT) switch circuit according to an embodiment of the present disclosure.

The teachings according to the present disclosure may equally apply to a shunt PCM device (105) (e.g., SW3 or SW4 of FIG. 3), or a through PCM device (e.g., SW1 or SW2 of FIG. 3). As will be described later, combinations of shunt and through PCM devices can be used in branches of more complex switches to provide operation according to, for example, a single-pole single-throw (SPST) switch, a single-pole double-throw (SPDT) switch, a single-pole multi-throw (SPMT) switch or any known complex switch configuration.

The information acquired by the logic and timing circuit (110) through PCM device state measurement signal (135) is processed in order to perform a self-test built in the circuit (110). The built-in self-test performed herein will be also called BIST (i.e., built-in self-test) throughout the present disclosure. In general, the processing steps performed in accordance with the present disclosure can be defined as a list of states operated through a state machine, an implementation of which can be provided within the logic and timing circuit (110) of FIG. 1.

Figure 2:
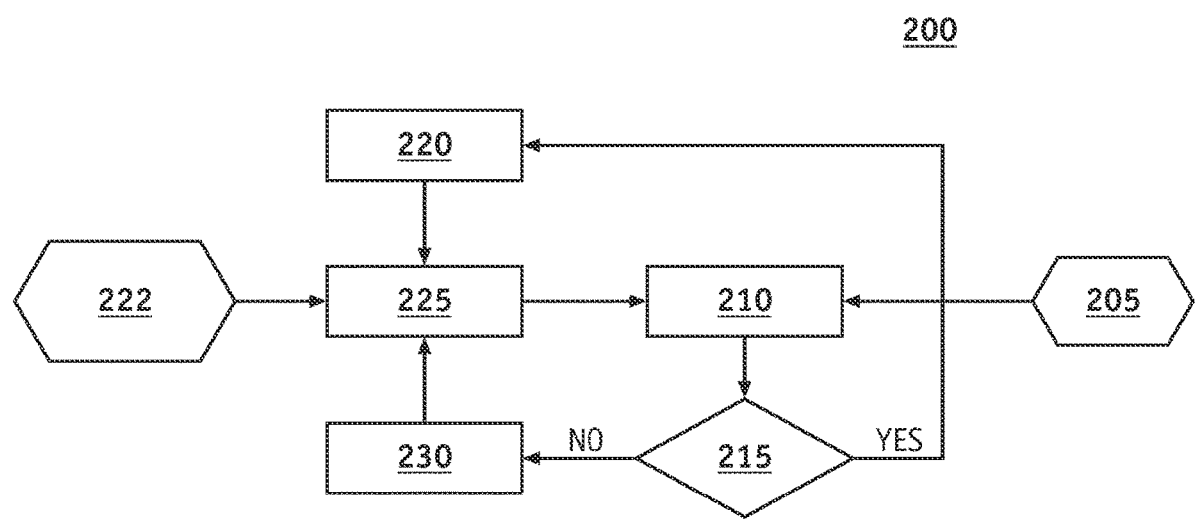
FIG. 2 shows various processing states and steps performed by a state machine for controlling operation of a switch device in accordance with an embodiment of the present disclosure.

An exemplary overview of the processing states and steps performed in accordance with an embodiment of the present disclosure is shown in the state machine (200) of FIG. 2.

After an initial power-on reset (POR) operation (205), measuring (210) of the state of a particular switch device (e.g., a PCM device) is performed through the steps and devices involved in the measuring phase described in FIG. 1 above, followed by a determination step (215). In particular, if the measured state matches the expected state (YES), then the state machine waits (220) for the next control signal (222) to arrive (see also inputs CLK and SW_ON to the control circuit (110) of FIG. 1) and further program (225) the device accordingly. If, on the other hand, the measured state does not match the desired/expected state (NO), then the state machine initially waits (230) for a cool-off time (of a predetermined length/duration) before programming (225) the switch again to obtain the desired/expected state. The presence of such programmable waiting time interval (i.e., cool-off time) is preferred in case of PCM devices, due to a maximum switching frequency that can be adopted for specific phase-change materials used in the PCM devices. Typical manufacturer-recommended cool-off time between programming ON and programming OFF the PCM device and vice versa may be of about a millisecond and up to few milliseconds.

Turning back now to the description of FIG. 1, the person skilled in the art will understand that reading and control arrangements for more than just a single switch device (e.g., 105) can be implemented. For example, as previously described, plural switch devices in the radio frequency (RF) field can usually be arranged either as through switches (between a first RF terminal and a second RF terminal) or shunt switches (between an RF terminal and a reference voltage, such as ground). This distinction is relevant for the purposes of the present disclosure, as establishment of a measurement path like path VDD-130-L1-P1 shown in FIG. 1, will require the path to terminate to ground, or to a known reference voltage, in order for the measurement to correctly occur. While a measurement current path to ground is inherently present in shunt switches, the present disclosure provides for the addition of resistive termination loads (e.g., 50 ohm termination loads) terminated to ground in case of through switches to allow such measurement to occur. Reference can be made to FIG. 3, which shows an embodiment of the present disclosure applied to a single-pole double-throw (SPDT) switch (see, e.g., U.S. Pat. No. 6,804, 502 incorporated herein by reference in its entirety). In particular, the SPDT switch shown in FIG. 3 may selectively switch one of the RF1 or RF2 ports to a common port that is coupled to an output load (e.g., Rc). If desired, a portion of the circuit can be on-chip, while a separate portion (e.g. resistors R1, R2 and Rc) can be off-chip.

As schematically shown in FIG. 3, the SPDT switch includes through switches SW1, SW2 and shunt switches SW3, SW4, that may be partitioned into a first arm that includes switches (SW1, SW3) and a second arm that includes switches (SW2, SW4). By way of example, all such switches can be implemented as PCM devices. Coupled to each switch is a switch state reading arrangement, comprised of a current injecting FET Ti (i=1, 2, 3, 4) and a corresponding isolation inductor Li (i=1, 2, 3, 4). Additionally, as also previously explained, resistive loads R1 and R2 (e.g., 50 ohm resistors to ground) are respectively provided in correspondence of through switches SW1 and SW2 in order to allow for a more accurate/precise measurement of the switch resistances via reading arrangements T1, L1 and T2, L2.

With continued reference to FIG. 3, the person skilled in the art will understand that, when a reading arrangement for a plurality of switches is provided (e.g., four switches in the SPDT of FIG. 3), risk of interference among the various readings is high (since a measuring current can be conducted through unintended paths). As a consequence, in accordance with embodiments of the present disclosure, several implementations are undertaken to reduce or minimize such risk.

A first implementation provides for performing the measurement steps of the various switches sequentially, in separate measurement periods of time or, in other words, separate and distinct measurement time intervals. In case of an SPDT switch, such as one shown in FIG. 3 that includes a first arm (SW1, SW3) and a second arm (SW2, SW4), the following four steps could be separately followed in an ordered fashion: measurement of the state of SW3 (shunt switch of the first arm), measurement of the state of SW1 (through switch of the first arm), measurement of the state of SW4 (shunt switch of the second arm) and measurement of the state of SW2 (through switch of the second arm). Of course, other sequences are possible, as long as each of them is separate in time from the others.

A second implementation provides for the addition of auxiliary FET switches to help isolate each measurement. In particular, measurement of the state of a shunt switch (e.g., SW3 or SW4 of FIG. 3) of an arm can potentially be influenced by the presence of the through switch on the same arm and (in lesser fashion) by the presence of the through switch on the other arm, given the additional paths to ground established through their respective resistive loads once a reading current is injected into the shunt switch. Similarly, measurement of the state of a through switch (e.g., SW1 or SW2 of FIG. 3) of an arm can potentially be influenced by the presence of the through switch on the other arm and by the presence of the shunt switch on the same arm.

In particular, the second implementation provides for the presence of additional logic bypass and current injection timing circuit coupled to devices not currently measured, in order to reduce or minimize their interference, by a) bypassing their current and/or b) having extra current injected therein, to obtain a more accurate/precise (e.g., correct) reading from the device under measurement. Such additional logic bypass and current injection timing circuit will be now described in detail, with combined reference to FIG. 3 and FIG. 4.

When measuring a through switch of an arm, a path to ground for the measurement current that bypasses the shunt switch on the same arm is provided. This is initially shown in FIG. 3, through the presence of nMOS (transistor) bypass switches T5 and T6 provided in each shunt switch reading/measurement circuit, wherein such nMOS switches, differently from their corresponding T3 and T4 pMOS switches, are switched ON when a through switch on the same arm (i.e., SW1 or SW2) is read, respectively. In this way, the reading current from T1, L1 (or T2, L2), after passing through SW1 (or SW2), goes to ground through T5 (or T6) instead of passing through SW3 (or SW4).

In addition to the above, a further improvement of the process of measuring the state of a shunt switch is provided in accordance with a further embodiment of the present disclosure. In particular, current generated through T1 . . . T4 is injected into the SPDT switch not only for reading the state of respective switches SW1 . . . SW4 but also to inject current into resistors R1 and R2 outside of the reading time interval for a specific switch. In other words, when measuring e.g., a shunt switch via an associated reading/measurement circuit, additional current is injected into the external resistive loads (e.g., R1 and R2 in FIG. 3) of the through switches (SW1, SW2) via activation (through the control circuit (110) of FIG. 1) of the current sources of the respective associated reading/measurement circuits, so that such switches do not appear as shorts to the shunt switch reading/measurement circuit. Similarly, when the state of a through switch (e.g., SW1) of one arm is read, additional current is injected into the external resistive load of the through switches (e.g., SW2) of the other arms, so that the through switch and the shunt switch of the other arms do not appear as a shorts to the through switch reading/measurement circuit.

By way of example, with reference to the SPDT switch of FIG. 3 and assuming the presence of four measurement phases in correspondence of the four PCM devices/switches (SW1, SW2, SW3, SW4), the operation of respective logic circuits (e.g., circuit (110) of FIG. 1) may include the following sequence of operations:

Phase 1: Measurement of shunt switch SW3: inject reading current in SW3 (through control circuit for SW3) and inject current in external loads R1 and R2 (through control circuits for SW2 and SW3)

Phase 2: Measurement of through switch SW1: inject reading current in SW1 (through control circuitry for SW1), bypass SW3 (through control circuit for SW3) and inject current in external loads R1 and R2 (through control circuits for SW1 and SW4).

Phase 3: Measurement of shunt switch SW4: inject reading current in SW4 (through control circuit for SW4) and inject current in external loads R1 and R2 (through control circuits for SW1 and SW4).

Phase 4: Measurement of through switch SW2: inject reading current in SW2 (through control circuit for SW2), bypass SW4 (through control circuit for SW4) and inject current in external loads R1 and R2 (through control circuits for SW2 and SW3).

Figure 4:
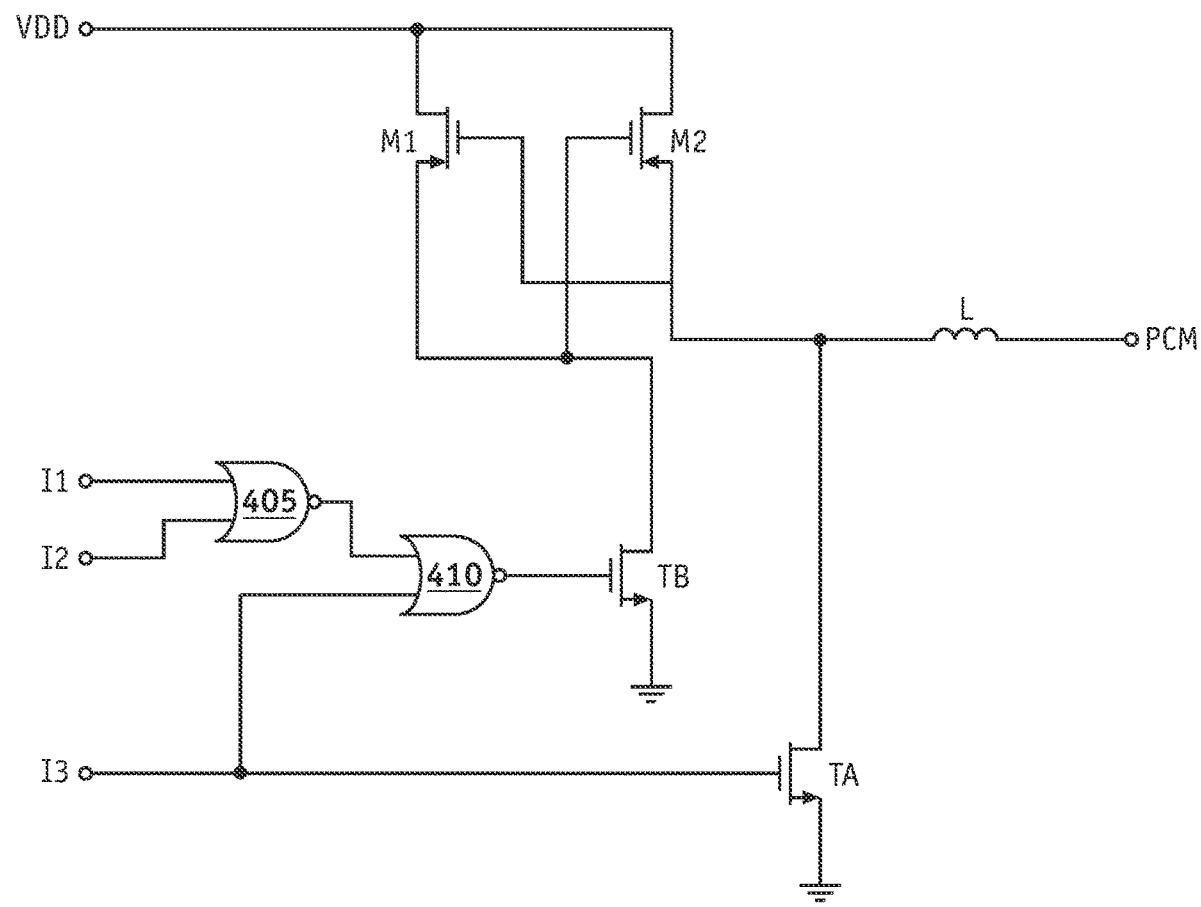
FIG. 4 shows an exemplary switch control circuit according to an embodiment of the present disclosure.

In order to be able to perform the above outlined sequences of operation, a more complex design may be provided for each switch control circuit, as shown in FIG. 4. In particular, the control arrangement of FIG. 4 can be adopted both in case of shunt switch control (compare with T3, T5 or T4, T6 of FIG. 3) and in case of through switch control (compare with T1 or T2 of FIG. 3). A detailed description of the structure and operation of the circuit of FIG. 4 will now follow.

As shown in FIG. 4, p-MOSFETs M1 and M2 provide a current source for current to be injected to a PCM device through inductor L.

The case where the circuit of FIG. 4 pertains to a shunt switch (e.g., switch SW3 of FIG. 3) will be described first. In such case, input I1 is asserted (I1=HIGH) when the state of the shunt switch to which the control circuit pertains (e.g., SW3) is being read. On the other hand, input I2 is asserted (I2=HIGH) when the state of the through switch on the opposite arm (in this case SW2) is being read. Finally, input I3 is asserted (I3=HIGH) when the state of the through switch on the same arm (in this case SW1) is being read.

In particular, assuming now that the circuit of FIG. 4 specifically pertains to shunt switch SW3, and making reference to the four exemplary phases described above:

In Phase 1, in order to read the state of shunt switch SW3, the shunt switch control circuit of FIG. 4 injects current in SW3 (and consequently in R1, R2 and Rc in an amount depending on the state of SW1 and SW2). This is a case where I1=HIGH, while I2=LOW and I3=LOW. The output of NOR logic gate (405) will be LOW, while the output of NOR logic gate (410) will be HIGH, thus turning (transistor) switch TB ON and enabling the current source formed by M1 and M2 to deliver current to the shunt switch SW3.

In Phase 2, when the state of through switch SW1 is being read, the shunt control circuit of the switch SW3 advantageously allows for the reading current coming from through switch SW1 (i.e., the through switch of the same arm) to bypass the switch SW3. This is a case where I1=LOW, while I2=LOW and I3=HIGH. The output of NOR (405) will be HIGH, while the output of NOR (410) will be LOW, thus turning switch TB OFF and not allowing current to be injected through the control circuit of the shunt switch SW3. However, I3=HIGH turns switch TA ON, thus creating a bypass path to ground for SW1's reading current entering the control circuit of the switch SW3, thus bypassing SW3.

In Phase 3, when the state of the other shunt switch SW4 is being read, all of I1, I2, and I3 of the control circuit of the switch SW3 are LOW. In such case both TA and TB are OFF, which means that no current is being injected by the control circuit of the switch SW3 and no bypass path is being formed for bypassing of the switch SW3.

In Phase 4, when the state of the through switch SW2 on the other arm is being read, I2 goes HIGH, thus turning switch TB ON and allowing injection of current into R1, R2 and Rc in an amount depending on the state of SW1 and SW2. This current injection is beneficial, because it will allow a more accurate/precise reading of the state of through switch SW2.

Similar observations can be made in case the circuit of FIG. 4 pertains to shunt switch SW4 of FIG. 3. It should be noted that the logic implemented by the NOR gates (405, 410) in the circuit shown in FIG. 4 may be implemented via other type of logic gates.

According to a further embodiment of the disclosure, the circuit of FIG. 4 can also be implemented as control circuit for a through switch (e.g., switch SW1 of FIG. 3). In such case, input I1 is asserted (I1=HIGH) when the state of the through switch to which the control circuit pertains is being read. On the other hand, input I2 is asserted (I2=HIGH) when the state of the shunt switch on the opposite arm (in this case SW4) is being read. Finally, input I3 is never asserted in case of a through switch (I3=LOW), which means that, differently from the control circuit of a shunt switch described above, the control circuit of a through switch does not have a need to create a bypass path. This aspect can also be generally seen from FIG. 3, where switches T5 and T6 are only provided in the control circuit for the shunt switches.

In particular, assuming now that the circuit of FIG. 4 specifically pertains to the through switch SW1, and making reference again to the four exemplary phases described above:

In Phase 1, where the state of shunt switch SW3 is being read, all of I1, I2 and I3 of the control circuit of SW1 are LOW. In such case, both TA and TB are OFF, which means that no current is being injected by the control circuit of the switch SW1.

In Phase 2, in order to read the state of through switch SW1, the through switch control circuit of FIG. 4 injects current in SW1 (and consequently in R1, R2 and Rc depending on the state of SW1 and SW2). This is a case where I1=HIGH, while I2=LOW and I3=LOW. The output of NOR (405) will be LOW, while the output of NOR (410) will be HIGH, thus turning the switch TB ON and enabling the current source formed by M1 and M2 to deliver current to the through switch SW1.

In Phase 3, where the state of the shunt switch SW4 on the opposite arm is being read, I2 goes HIGH, thus turning switch TB ON and allowing injection of current into R1, R2 and Rc depending on the state of SW1 and SW2. This current injection is beneficial, because it will allow a more accurate/precise reading of the state of the shunt switch SW4.

In Phase 4, where the state of the through switch SW2 is being read, all of I1, I2, and I3 of the control circuit of the switch SW1 are LOW. In such case both TA and TB are OFF, which means that no current is being injected by the control circuit of the switch SW1.

Similar observations can be made in case the circuit of FIG. 4 pertains to through switch SW2 of FIG. 3.

Turning back to the representation shown in FIG. 1, the ADC may be implemented through at least one comparator, providing a first digital value for voltages below a certain (preset) level ("trip point") and a second digital value for voltages above such level. Given that the resistive value read by the arrangement of FIG. 1 is not read in isolation as the switch under observation may be coupled to other circuits such as the resistive loads discussed above, the person skilled in the art will understand that the trip point may be chosen with some care in dependence of overall circuit topology, including for example, values and disposition of other components in the circuit under measure.

Figure 5:
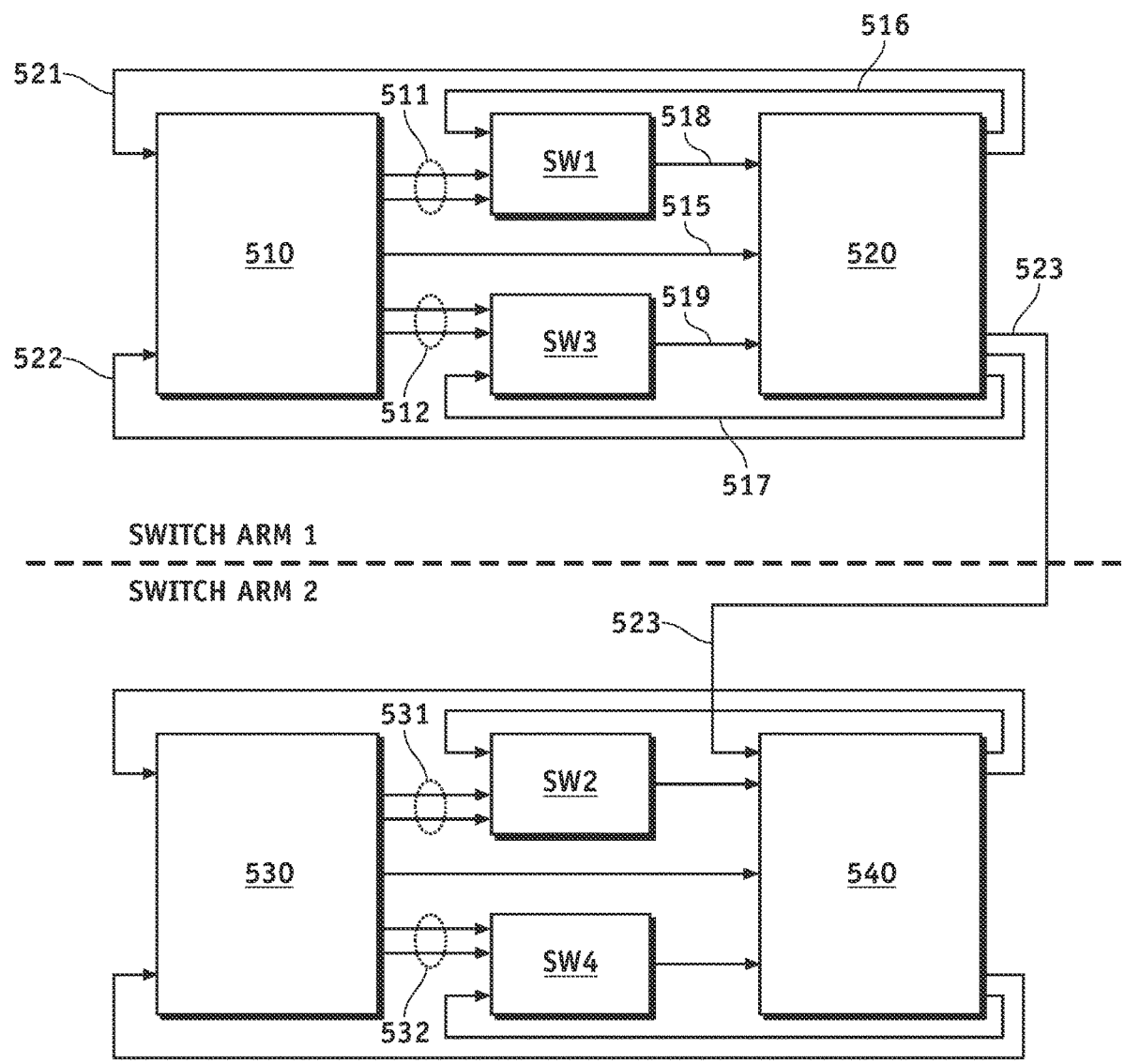
FIG. 5 shows various control processing steps performed by state machines for controlling and testing operation of the SPDT switch circuit of FIG. 3 in accordance with an embodiment of the present disclosure.

Reference will now be made to FIG. 5, which shows a series of control processing steps, implemented by a (respective) state machine controller, in case of the previously discussed (branches of the) SPDT switch. The processing steps and related controllers represent a specific example of the general process previously discussed with reference to FIG. 2.

A first state control machine (510) and a first BIST (520) are provided for the through and shunt switches SW1, SW3 of the first arm, while a second state control machine (530) and second BIST (540) are provided for the through and shunt switches SW2, SW4 of the second arm.

Each state control machine (510, 530) include outputs (511, 512) and (531, 532) controlling ON state and OFF state programming of each switch. Once (an attempt for) programming of switches SW1 and SW3 is completed, the state control machine (510) outputs a "done" signal (515) to start operation of BIST (520) for testing/checking/validating success of the programming. In this case, BIST (520) sends measuring signals (516, 517) to the switches SW1 and SW3, responsive to which the switches SW1 and SW3 output result signals (518, 519)—i.e. the digital results of the measurement after the analog-to-digital conversion- to BIST (520). If BIST (520) determines that the (attempt for) programming of the switches SW1 and/or SW3 as unsuccessful (see also decision step (215) of FIG. 2), it is going to assert one or both "again" signals (521, 522) (one for each switch) to the state control machine (510) and start the process again by programming the switch or switches one more time. Any one of the "again" signals (521, 522) may be asserted (and reasserted) in case of no success in programming of an associated switch. Once the process ends for the first arm switches SW1 and SW3 (i.e. successful programming), control is transferred to the controllers (530, 540) below through a signal (523) output by the BIST (520), thus allowing the entire process to be cascaded to a larger number of switches than just two and then daisy-chained back to the initial switch or switches. Operation of such additional controllers is similar to the one described above and will not be discussed here in detail.

As noted in FIGS. 2 and 5 above, there are cases where the measured state of a switch (e.g., a MEMS or PCM switch) does not match its desired/expected state (unsuccessful attempt in programming), thus requiring (possibly after a cool-off time) a further programming of the switch in the attempt of forcing the switch away from its current state and into the desired/expected state. This was shown in boxes (225, 230) of FIG. 2 and related written description, and is shown in FIG. 5 by implementation of the "again" signals (521, 522) sent by BIST (520) to state control machine (510). The following FIG. 6 will show, in more detail, a timing diagram related to various control signals used in the operation of the SPDT switch of FIG. 3.

Figure 6:
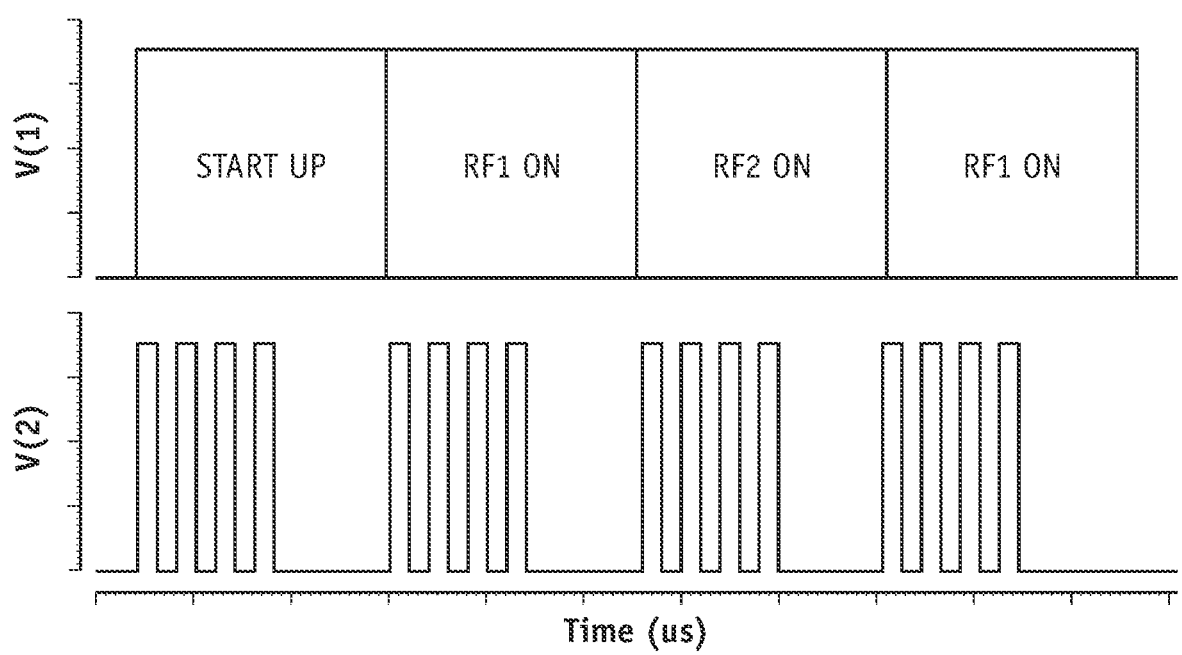
FIG. 6 shows a timing diagram related to various control signals used in the operation of the SPDT switch of FIG. 3.
Figure 7:
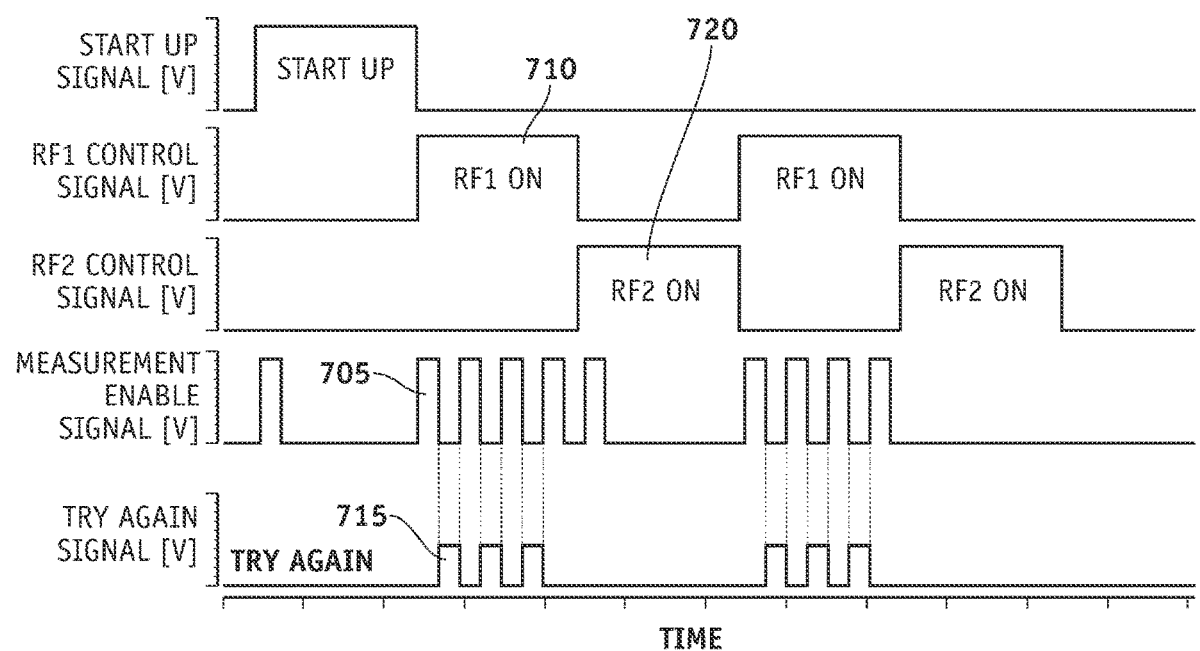
FIG. 7 shows a timing diagram related to various control signals in case of unsuccessful programming of a switch device in accordance with an embodiment of the present disclosure.

The top portion of the timing diagram of FIG. 6 corresponds to a superposition of control signal pulses representative of the status of the SPDT switch as asserted through the output of the bus controller (115) of FIG. 1. These include a Startup state, a RF1ON state, and a RF2ON state, wherein each such state may be asserted through a corresponding control signal (e.g., a pulse) that may be set to, for example, a HIGH level during the state (and a LOW level during a different state, as shown in FIG. 7 later described). As shown in FIG. 6, after a startup state, the states of the SPDT switch may include, for example, a state, RF1ON, defined by the RF1 input of the SPDT switch being connected to the output of the SPDT switch, and a state, RF2ON, defined by the RF2 input of the SPDT switch being connected to the output of the SPDT switch. It should be noted that after the Startup state, any sequencing of states RF1ON and RF2ON may be provided via the bus controller (115) of FIG. 1 in dependence of an intended use of the SPDT switch in a corresponding circuit.

As shown in the bottom portion of the timing diagram of FIG. 6, for each change of state, the (sequence of the) four measurement phases described above may be performed (e.g. measurement of state of through switch SW1 of arm 1, measurement of state of shunt switch SW3 of arm 1, measurement of state of through switch SW2 of arm 2, and measurement of state of shunt switch SW4 of arm 2), in order to establish and/or ascertain the state of each of the switches that make up the (arms of the) SPDT switch. For example, during the Startup state, the four measurement phases may be used to establish the respective states of the switches (SW1, SW2, SW3, SW4) whereas after transition into an operational state (e.g., RF1ON or RF2ON), the four measurement phases may be used, in combination with the above described programming pulses (not shown in FIG. 6), to ascertain the respective states of the switches (SW1, SW2, SW3, SW4) as dictated by the specific operation of the SPDT switch.

Reference will now be made to the timing diagram of FIG. 7, which shows a scenario of an unsuccessful programming of a switch (e.g., SW3 of FIG. 3) for operation of the SPDT switch of FIG. 3 according to the RF1ON state. In particular, the unsuccessful programming may be obtained (e.g., simulated, forced), for example, by intentionally reducing a supply voltage so that (e.g., through the associated driver 120/125 of FIG. 1) it does not have enough power to perform programming of a specific shunt switch (e.g., SW3 of FIG. 3) for operation in the RF1ON state. In other words, such scenario intentionally prevents the shunt switch (e.g., SW3 of FIG. 3) from switching in the OFF state that is required for operation of the SPDT switch of FIG. 3 according to the RF1ON state. It should be noted that in the timing diagram of FIG. 7, and in contrast to the timing diagram of FIG. 6, the Startup, RF1ON, and RF2ON control signals are shown separated.

According to the above scenario, and with continued reference to FIG. 7, when a state of the shunt switch (e.g., SW3 of FIG. 3) is measured (705) during the time interval (710) of the RF1ON state of the system (e.g., of the SPDT switch of FIG. 3), its state is not as desired/expected (e.g., wrong). As a consequence, a "try again" signal (715) is asserted (see also "again" signals 521, 522 in FIG. 5) after the measurement (705), and the shunt switch (e.g., SW3 of FIG. 3) is programmed again (through, e.g., heater voltage programming pulses in case of a PCM switch, not shown in the figure). This process, including the sequence of programming, measuring and trying again, is repeated until the switch (e.g., SW3 of FIG. 3), is found to be in the desired/expected state. However, in this specific scenario and as shown in FIG. 7, given that there is not enough supply voltage to program the switch to its desired/expected state, the "try again" signal (715) is repeatedly asserted throughout the time interval (710) of the RF1ON state. On the other hand, when the system switches to the RF2ON state, the shunt switch (e.g., SW3 of FIG. 3) is in the desired/expected state (i.e., ON state) throughout the time interval (720) of the RF2ON state, and therefore, as shown in FIG. 7, a single measurement pulse (705) may be sufficient to detect the desired/expected state of the shunt switch (see also absence of additional programming and try again pulses in that state). The behavior in case of a faulty through switch is similar.

It should be noted that, if desired, the control machine can be configured to provide a "retry_max" signal that may be asserted when a counter that is configured to count a number of retries for programming of a specific switch (e.g., any one of SW1, SW2, SW3 or SW4 of FIG. 3) reaches a predetermined high count value (e.g., 32). Once the "retry_max" signal is asserted, the state machine may stop programming of the switch and report a (switch specific) failure to the controller.

As noted with reference to the description of FIG. 1, embodiments where the ADC converter has more than one bit can be provided. By way of example, several kinds of switch devices, including PCM devices, change characteristics over time. After a certain number of cycles, there may be a change and different variability in the Ron resistance of a switch device. In such cases, identification of the correct threshold to be able to distinguish between an ON state and an OFF state of the switch may be performed not by via a single-bit ADC having an ON or OFF value, but instead via a multi-bit value (e.g., digital word) to increase the resolution of the resistance measurement. In turn, such multi-bit value can be used as feedback to allow controlling/programming of the switch to obtain a desired Ron resistance value of the switch. Such controlling/programming may be provided by adjusting specific parameters, including pulse duration and/or injection current or voltage, of (programming) pulses to the switch.

According to an alternative embodiment of the present disclosure, instead of measuring an operational switch device (e.g., one that is effectively used to switch in/out an RF signal), a replica switch device (also representable through reference numeral 105 of FIG. 1) (e.g., one that is not coupled to the RF signal) corresponding to the operational switch device can be measured, in which case there would be no need for isolation, such as an isolation inductive arrangement. In such case, the replica switch device may be subjected to a same number of ON-OFF or OFF-ON switching cycles as the operational switch devices. In a further alternative embodiment, the measurement discussed so far can be implemented only for a production test.

Figure 8A:
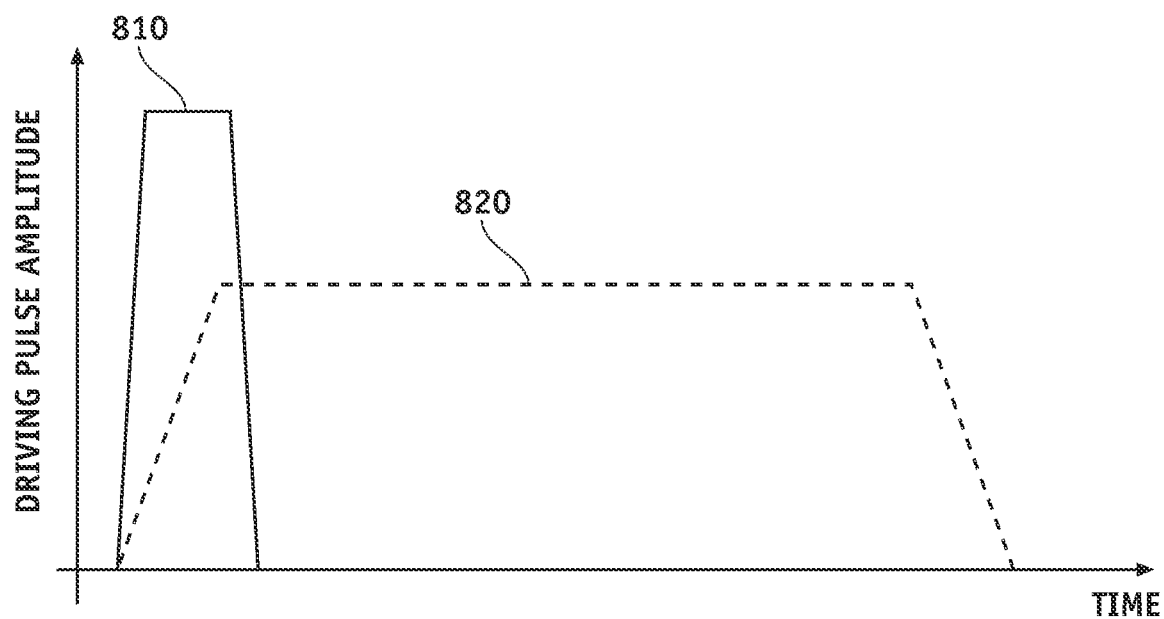
FIG. 8A shows two different electrical pulse profiles for switching the resistivity states of a PCM.

FIG. 8A shows two different electrical pulse profiles, for switching the resistivity states of the PCM (105) of FIG. 1. As described previously, such electrical pulse profiles are applied to the heating element (i.e. resistor) of PCM device (105) of FIG. 1 to generate different thermal profiles that result either in amorphizing the PCM device into a high resistance state (OFF or open) using a higher-power/amplitude, short-period pulse (810), or crystalizing the PCM device into a low resistance state (ON or closed) using a lower-power/amplitude, long-period pulse (820). In other words, PCM device (105) is programmed in an OFF or ON state by controlling the amplitude as well as the pulse widths of the pulses provided by the drivers (120, 125) of FIG. 1.

With continued reference to FIG. 1, during operative conditions, PCM device (105) may be at different temperatures. As such, the optimized pulse width and amplitude required to drive the PCM device may be controlled to differ from one temperature to another. In other words, due to change in temperature, the drivers may be advantageously designed to provide pulses having different pulse widths and amplitudes as a function of temperature. According to the teachings of the present disclosure, this can be implemented using a lookup table, an arithmetic logic unit (ALU) or a similar device that stores the required amplitude and pulse width information versus the temperature at which the PCM drive is operating.

Figure 8B:
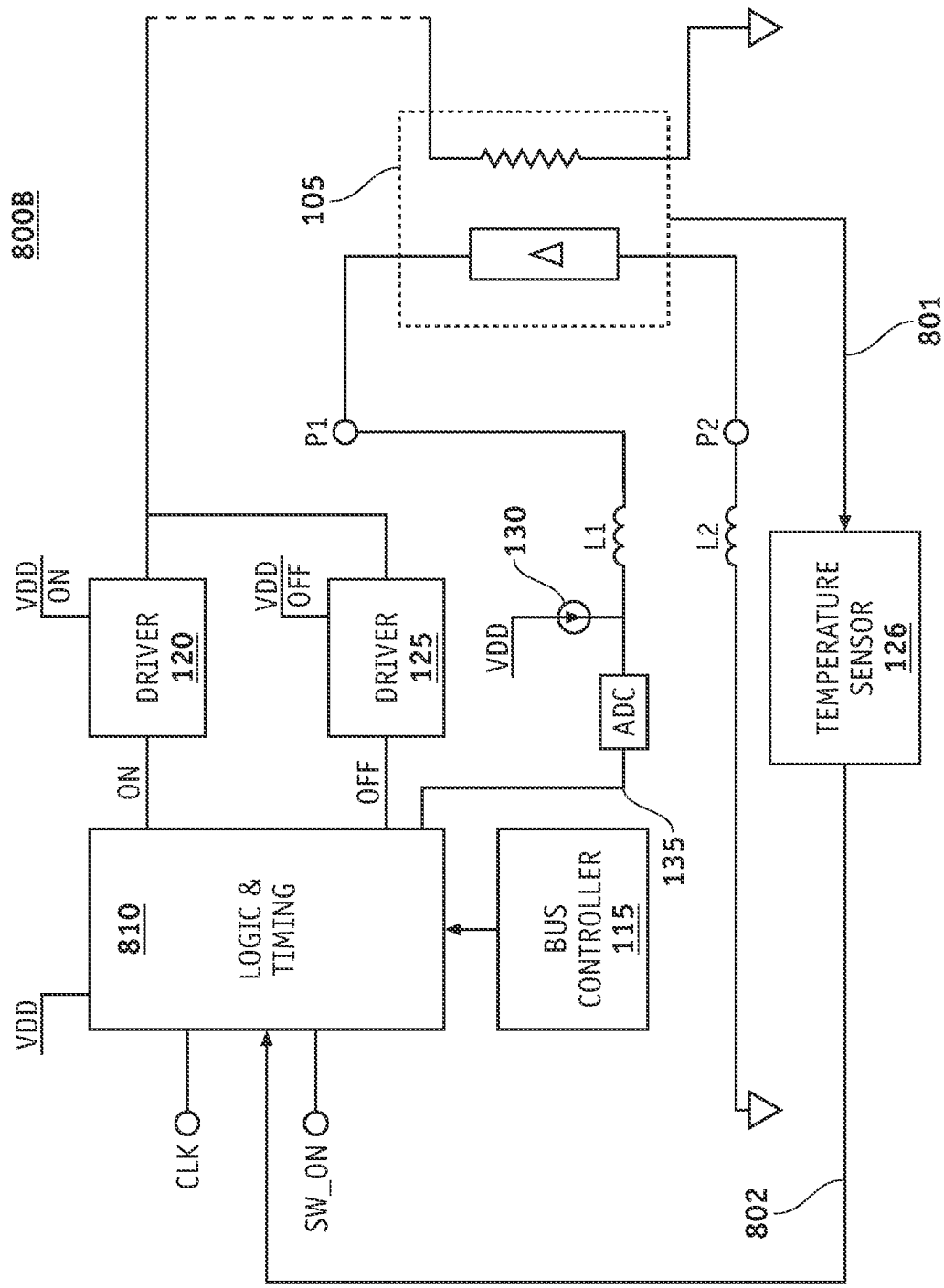
FIGS. 8B and 9 show simplified block diagrams of circuital arrangements in accordance with the present disclosure.

In order to further clarify the above-disclosed teachings, reference is made to FIG. 8B showing circuital arrangement (800B) in accordance with an embodiment of the present disclosure. The principle of operation of circuital arrangement (800B) of FIG. 8B is similar to what was described with regards to circuital arrangement (100) of FIG. 1, except for the addition of temperature sensor (126). This temperature sensor (e.g. a thermocouple or a thermistor) is configured to measure the temperature of PCM device (105), as indicated by arrow (801) and provide such information to control circuit (110), as indicated by arrow (802). Based on the measured temperature, control circuit (110) then provides the proper (e.g. previously determined) amplitude and pulse width information to drivers (120, 125).

Figure 9:
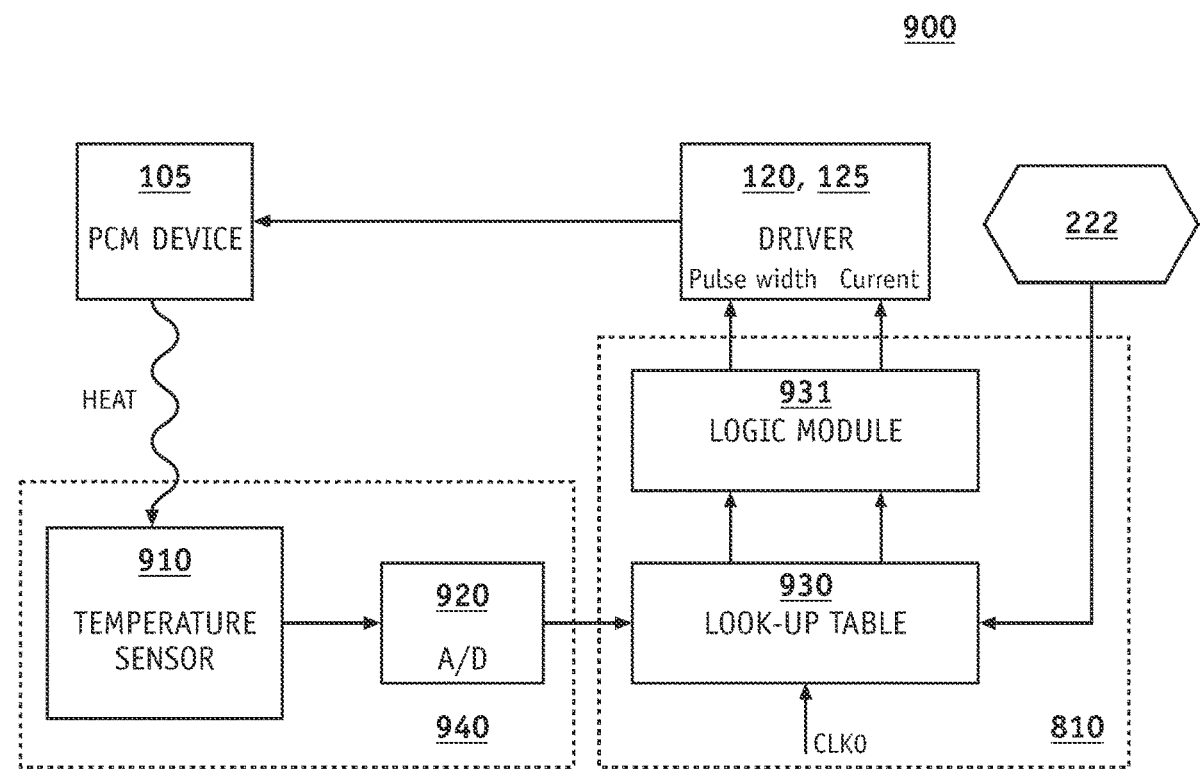

FIG. 9 shows another example circuital arrangement (900) in accordance with an embodiment of the present disclosure, representing an implementation of the temperature sensor and related elements in the circuital arrangement (800B) of FIG. 8B. As shown in FIG. 9, the heat generated by PCM device (105) is used to measure the PCM device temperature by temperature sensor (910). As a result, a corresponding analog signal is generated which is then digitized by analog to digital converter A/D (920) to generate a digital signal. Lookup table or ALU (930) then processes the generated digital signal to identify (by way of identifying appropriate predetermined on on-the-fly values) the proper pulse width and amplitude (e.g. amount of current) information in correspondence with the measured temperature. Logic module (931) then reads such information from lookup table or ALU (930) and provides the same to drivers (120, 125).

Also shown in FIG. 9 is user-generated control signal (222) which indicates which state, ON or OFF, the PCM device is required to be in. In other words, the functionality of control signal (222) is similar to what was described for the same in the embodiment of FIG. 2. In an embodiment, the pulse width and amplitude of the pulses supplied by the drivers may vary depending on the state of the PCM device. Specifically, the pulse width and amplitude of the pulse provided for the ON state may differ from those provided for the OFF state.

With reference to of FIGS. 1 and 8B, the material utilized in the fabrication of the PCM device may experience a resistance drift over time. In other words, as the device ages, its material does not crystallize in perfect form anymore. According to the teachings of the present disclosure, the amplitude and pulse width of the driving pulses may also be adjusted as a function of the operational time of the PCM switch to address such resistance drift issue. In other words, embodiments may be envisaged wherein the data stored within the lookup table or ALU accounts also for the amount of time the PCM device has been operational in the circuit. An exemplary implementation of this is shown in FIG. 9, wherein the data output from the lookup table or ALU (930) to logic module (931) is a function of the number of cycles occurring on clock signal (CLK0) which is used as an input to lookup table (930). In an embodiment, the number of cycles of the clock signal (CLK0) may be a measure of the number of times the PCM device undergoes transitions from one state to another during operative conditions.

With reference to FIGS. 1 and 2, state machine (200) can be implemented within control circuit (110) to control the operation of circuital arrangement (100) of FIG. 1. In accordance with the teachings of the present disclosure, the same state machine (200) can be run within control circuit (810) of FIGS. 8B-9 except that, as disclosed above, the amplitude and pulse width of the pulses driving the PCM device are this time a function of temperature, and optionally, a function of the operational time of the PCM device, and/or the desired state of the PCM device. Stated differently, the amplitude and pulse width of the driving pulses are constant in the case shown in FIG. 1, and this stands in contrast with the case of FIGS. 8B-9 where such amplitude and pulse width are adjusted based on, either solely temperature or a combination of temperature with time and/or the desired state (ON or OFF) of the PCM device.

According to the present disclosure, the disclosed teachings of the addition of temperature sensor and lookup table/ALU can be used in conjunction of the teachings disclosed previously in relation with FIGS. 3-7. In other words, the embodiment of FIGS. 8B and 9 can be used as an add-on to any of the previously described embodiments related to FIGS. 3-7.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A switch circuit arrangement comprising:
a control circuit;
a switch;
a driver circuit coupled to the control circuit and the switch,
wherein:
a) the control circuit further comprises a program mode of operation that is configured to:
   i) generate a first control pulse, provided to the driver circuit to program the switch to an ON state; and
   ii) generate a second control pulse, provided to the driver circuit to program the switch to an OFF state;
b) the driver circuit is configured to generate a first driving pulse in correspondence with the first control pulse;
c) the driver circuit is configured to generate a second driving pulse in correspondence with the second control pulse, and
d) a width and an amplitude of each of the first and the second driving pulses are each a function of a temperature of the switch.

2. The switch circuit arrangement of claim 1, further comprising a temperature sensor coupled to the control circuit and the switch, the temperature sensor being configured to measure the temperature of the switch and to generate an analog signal based on the measured temperature.

3. The switch circuit arrangement of claim 2, further comprising an analog-to-digital converter (A/D), the A/D being configured to generate a digital signal based on the analog signal generated by the temperature sensor.

4. The switch circuit arrangement of claim 3, wherein the control circuit is configured to receive the digital signal from the A/D and to generate the first and the second control pulses, based on the digital signal.

5. The switch arrangement of claim 4, wherein the control circuit comprises a device configured to store data related to the amplitude and width of the first and second driving pulses as a function of temperature.

6. The switch arrangement of claim 5, wherein the device comprises a lookup table or an arithmetic logic unit (ALU).

7. The switch circuit arrangement of claim 1, wherein the amplitude and the width of the first and the second driving pulses are also a function of a desired state of the switch, and/or an operational time of the switch.

8. The switch circuit arrangement of claim 7, wherein the amplitude and the width of the first and the second driving pulses are also a function of a number of times the switch undergoes a transition from one state to another while operating.

9. The switch circuit arrangement of claim 8, wherein the control circuit is configured to generate a clock signal, and wherein the number of times the switch undergoes a transition from one state to another while operating is indicated by a number of cycles of the clock signal.

10. The switch circuit arrangement of claim 1, wherein the switch is a phase-change material (PCM) switch.

11. The switch circuit arrangement of claim 1, further comprising a measurement circuit coupled to the control circuit, the measurement circuit comprising:
a current source;
a read mode of operation that is configured to:
   i) activate the current source to inject current through the switch, and
   ii) based on the current injected through the switch, read, through the measurement circuit, a resulting voltage to measure a programming status of the switch.

12. The switch circuit arrangement of claim 11, wherein the control circuit is further configured to:

receive a command to set the switch to a desired state according to one of the ON state or the OFF state, determine the state of the switch via the read mode of operation, and program the switch via the program mode of operation if the state of the switch is determined not to be the desired state.

13. The switch circuit arrangement of claim 12, wherein the control circuit is further configured to:

determine again the state of the switch via the read mode of operation after the program mode of operation, and program again the switch via the program mode of operation if the state of the switch is determined again not to be the desired state.

14. The switch circuit arrangement of claim 13, wherein the program again occurs after a programmable wait time that limits a rate of consecutive programming of the switch.

15. The switch circuit arrangement of claim 13, wherein the read mode of operation and the program mode of operation of the control circuit operate as a state machine.

16. A method of programming a state of a phase change material (PCM) switch, comprising:

measuring a temperature of the PCM switch;

in correspondence with an ON state of the PCM switch, applying a first driving pulse to the switch;

in correspondence with an OFF state of the PCM switch, applying a second driving pulse to the PCM switch, and adjusting an amplitude and a width of the first and the second driving pulses based on the measured temperature of the PCM switch.

17. The method of claim 16, wherein:

the amplitude of second driving pulse is greater than the amplitude of the first driving pulse, and the width of the second driving pulse is shorter than the width of the first driving pulse.

18. The method of claim 17, where in data related to the amplitude and the width of the first and the second driving pulses versus temperature are stored in a lookup table or an arithmetic logic unit (ALU).

19. The method of claim 17, wherein the adjusting of the amplitude and width of the first and the second driving pulses is further based on a desired state the PCM switch.

20. The method of claim 17, wherein the adjusting of the amplitude and the width of the first and the second driving pulses is further based on an operational time of the PCM switch.

21. The method of claim 20, wherein the operational time of the PCM switch serves as an indicator of a total number of transitions, from one state to another, the switch undergoes in operative conditions.

* * * * *